United States Patent
Moffat et al.

(10) Patent No.: US 7,357,874 B2
(45) Date of Patent: Apr. 15, 2008

(54) STAGGERED VERTICAL COMB DRIVE FABRICATION METHOD

(75) Inventors: Steven H. Moffat, Mississippi Mills (CA); John M. Miller, Gatineau (CA)

(73) Assignee: JDS Uniphase Corporation, Milpitas, CA (US)

( * ) Notice: Subject to any disclaimer, the term of this patent is extended or adjusted under 35 U.S.C. 154(b) by 0 days.

(21) Appl. No.: 11/733,821

(22) Filed: Apr. 11, 2007

(65) Prior Publication Data

US 2007/0241076 A1    Oct. 18, 2007

Related U.S. Application Data

(60) Provisional application No. 60/791,346, filed on Apr. 12, 2006.

(51) Int. Cl.
*C23F 1/00*  (2006.01)

(52) U.S. Cl. ........................................................ 216/2

(58) Field of Classification Search .................... 216/2; 310/309; 73/504.12; 438/52
See application file for complete search history.

(56) References Cited

U.S. PATENT DOCUMENTS 7,258,010 B2 *  8/2007  Horning et al. .......... 73/514.32

\* cited by examiner

*Primary Examiner*—Roberts Culbert
(74) *Attorney, Agent, or Firm*—Teitelbaum & MacLean; Neil Teitelbaum; Doug MacLean

(57) ABSTRACT

The invention relates to a method of fabrication of staggered vertical comb drive actuators with relaxed lateral alignment tolerances. A device layer of a wafer is first etched from a front side using a self-aligned two-layer mask to define interdigited fingers of both moving and stationary combs. A second etch step is used for vertically thinning one of the two sets of fingers by selectively removing their top portions. The front side of the wafer is then bonded to a carrier wafer. The wafer is then selectively etched from the back side of the device layer so as to remove lower portions of the second set of fingers, thereby forming interdigited moving and stationary combs having vertically offset fingers.

18 Claims, 8 Drawing Sheets

Material Legend

| | | | |
|---|---|---|---|
| ☐ | Mask 1, SiO2 or SixNy | ▓ | SiO2, SOI Wafer Buried oxide Layer |
| ▓ | Mask 2, Photoresist | ▒ | Si, Device Handle Wafer |
| ☐ | Si, SOI Handle Wafer | ▓ | Reflective Coating |
| ☐ | Si, SOI Device Layer | ■ | Si, Shadow Mask |

STAGGERED VERTICAL COMB DRIVE FABRICATION METHOD

CROSS-REFERENCE TO RELATED APPLICATIONS

The present invention claims priority from U.S. Provisional Patent Application No. 60/791,346 filed Apr. 12, 2006, entitled "Staggered Vertical Comb Drive Fabrication Process with Relaxed Alignment Tolerance", which is incorporated herein by reference.

TECHNICAL FIELD

The present invention relates generally to vertical comb drive actuators and to methods of fabrication thereof, and more particularly to a method of fabrication of an efficient vertical staggered comb drive actuator with improved alignment tolerances.

BACKGROUND OF THE INVENTION

A staggered vertical comb drive (SVCD) is a type of MEMS (Micro-Electro Mechanical Systems) actuator capable of relatively high actuator strength and a high speed using electrostatic principal of operation. Furthermore, they can be fabricated using standard materials and scalable processes developed in the semiconductor industry. SVCDs can be advantageously used to control high-speed, high-resolution micromirrors in a variety of optical applications including optical scanning, optical switching, free-space optical communications, optical phased arrays, optical filters, external cavity lasers, adaptive optics and other applications.

The actuation principle of a typical SVCDs is electrostatic. A potential difference is applied between two comb structures, a movable comb, or a rotor, and a stationary comb, or a stator. When a voltage is applied between them, the movable comb (rotor) is drawn toward the stationary comb (stator) until the teeth of the stator and rotor overlap and the electrostatic field energy is minimized. Different types of SVCD devices are described in further detail, for example, in U.S. Pat. No. 6,612,029 to Behin et al, which is incorporated herein by reference.

FIG. 1 illustrates a typical prior art SVCD 20. The SVCD 20 includes a stator 22 and a rotor 30. The stator has individual comb fingers 24 formed on a spine 26. The rotor 30 includes individual comb fingers 32 linked by a spine 34. The rotor 30 also includes a mirror or paddle 40 with associated torsional hinges 42. In a resting state the rotor 30 is positioned substantially above the stator 22 as shown in FIG. 1.

FIG. 2 illustrates the SVCD system 20 in an activated state. This state is achieved by applying a voltage between the rotor 30 and the stationary comb assembly 22. In this state, the individual combs of the rotor and stator interdigitate. The applied voltage attracts the rotor 30 to the stator 22, thus exerting torque on the torsional hinges 42, forcing the mirror 40 to tilt. The torsional hinges 42, which are anchored, provide restoring torque when the voltage is removed.

A typical prior art process flow involves creating the moving comb assembly 30 by etching one silicon-on-insulator (SOI) wafer, and the stationary comb assembly 22 by etching another SOI wafer, and then assembling, for example bonding, the etched wafers together to form the SVCD 20. Different versions of such process are described in U.S. Pat. Nos. 6,925,710, 7,079,299, etc. However, stringent alignment requirements between the two wafers from which the two comb assemblies are formed can considerably complicate the device processing and negatively affect the device yield.

Alignment of the stator and rotor fingers is critical to proper operation of the actuator. Failure to achieve the required alignment can impair the actuator performance and/or reliability as a result of failure modes such as electrical breakdown, mechanical interference, and lateral collapse.

Typically the rotor and stator must be aligned laterally, i.e. in the plane of the wafer and the combs, to approximately one micron or better. However, when the rotor and stator are fabricated from different wafers, accuracy of a front side to back side wafer alignment, and of the lateral alignment of the wafer bond can be of the order of three microns (3 sigma) across a wafer.

To overcome this difficulty, techniques have been proposed for self-aligned manufacturing of the rotor and stator fingers, wherein both the rotor and stator a photolithographically fabricated from a same device layer of a SOI wafer.

For example, U.S. Pat. No. 6,612,029 to Behin, et al discloses a method of simultaneous fabrication of the rotor and stator fingers from the same device layer that includes two conductive silicon layers separated by an isolation layer of a silicon oxide. The final device has at least one set of fingers, for example of the rotor, each of which has two vertically stacked conductive layers separated by the isolation oxide layer. In operation, one of said conductive layers is grounded, and the voltage is applied to the other to create a pulling electrical field between said layer and the adjacent fingers of the stator which are grounded. The stator fingers can be etched down to the isolation layer to form a thinned set of stator fingers. In one embodiment, the isolation oxide layer is removed leaving an air gap in the respective fingers.

Although the SVCD fabrication method disclosed by Behin et al provides self-aligned rotor and stator, it has other disadvantages. One disadvantage of this method is that the multi-layer fingers it forms may suffer from electrical breakdown at high voltages, which effectively limits the applied voltage and thereby—the rotation angle of the rotor. This limitation can be especially severe if the oxide layer separating the conducting layers of the fingers is removed, forming the air gap; additionally, the air gap embodiment can be sensitive to the presence of small dust particles, which can electrically shorten the device. If the oxide layer is not removed, its electrical properties can drift over time; for example, it can accumulate static electrical charge over time altering the electric field coupling the stator and rotor, leading to undesirable variations and/or aging of the device performance.

US Patent application 2007/0026614 to Choo, et al discloses an SVCD fabrication method which is somewhat similar to the method of Behin et al, but wherein the device layer from which the rotor and stator are fabricated in a single conductive silicon layer without the isolating oxide layer in the middle, using a two-layer mask to separately define the rotor and stator fingers. One set of the fingers is thinned by a timed etch process to about half of the device layer height, while the other set remains full-height. Although the resulting device is free from the disadvantages of the Behin SVCD discussed hereinabove, it has others. One disadvantage of the method of Choo et al is that it results in a device with a reduced rotation angle of the rotor, since the applied voltage can only rotate the rotor until a middle point of its fingers is aligned with a middle point of the stator fingers. For example, in the device of Choo, the middle points of the rotor and stator fingers in a rest state, when no voltage is applied, are separated only by about a quarter of the device layer height, as opposed to the separation of about a half of the device layer height for the device of Behin.

An object of the present invention is to provide a self-aligned method of fabrication of SVCD devices that are free from all or at least some of the above described and other disadvantages of the prior art methods.

SUMMARY OF THE INVENTION

In accordance with the invention, a method is provided for fabricating a staggered vertical comb drive, the method comprising the steps of: a) providing a wafer comprising a device layer, b) etching the device layer to form therein two comb structures comprising a first set of fingers interdigited with a second set of fingers, c) removing a top portion of each finger from the first set of fingers by etching, so as to vertically shorten the first set of fingers, and attaching a carrier wafer to the device layer for supporting thereof, and d) removing a lower portion of each finger from the second set of fingers by etching from a back side of the wafer, so as to vertically shorten the second set of fingers resulting in said second set of fingers being vertically offset from the first set of fingers.

In one embodiment, step d) comprises the step of first forming a third mask on the back side of the wafer to protect the first set of fingers during the etching in step (d), and to expose to said etchings the lower portions of the second set of fingers.

In accordance with another feature of this invention, the step of forming the two-layer mask comprises the steps of: a1) forming a first mask over the device layer so as to expose portions thereof corresponding to the first set of fingers, a2) disposing, over the device layer and the first mask, a masking layer which is substantially resistant to an etch process used in step (b); and, a3) removing portions of the masking layer to form a second mask defining fingers of the first and second sets and exposing portions of the wafer therebetween.

In a preferred embodiment of the invention the device layer is conductive, the wafer further comprising an isolation layer sandwiched between the device layer and a base layer, which is at least partially removed prior to step (d).

BRIEF DESCRIPTION OF THE DRAWINGS

The invention will be described in greater detail with reference to the accompanying drawings which represent preferred embodiments thereof, wherein.

DETAILED DESCRIPTION

Figure 1:
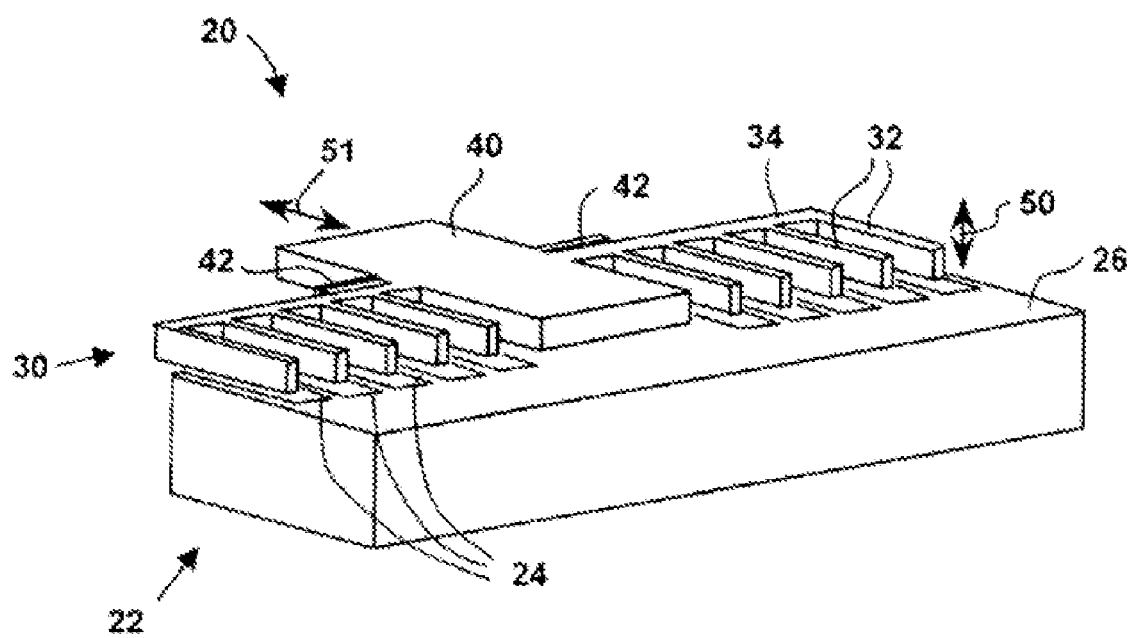
FIG. 1 is an isometric diagram of a prior art staggered vertical comb drive (SVCD) in a resting state.
Figure 2:
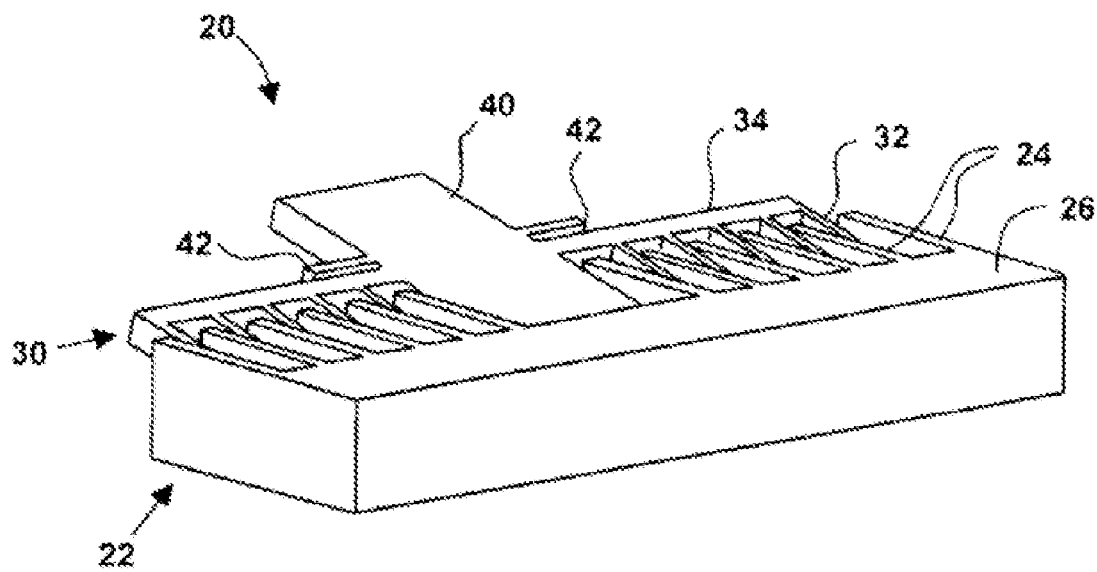
FIG. 2 is an isometric diagram of the prior art SVCD shown in FIG. 1 in an activated state.
Figure 3A:
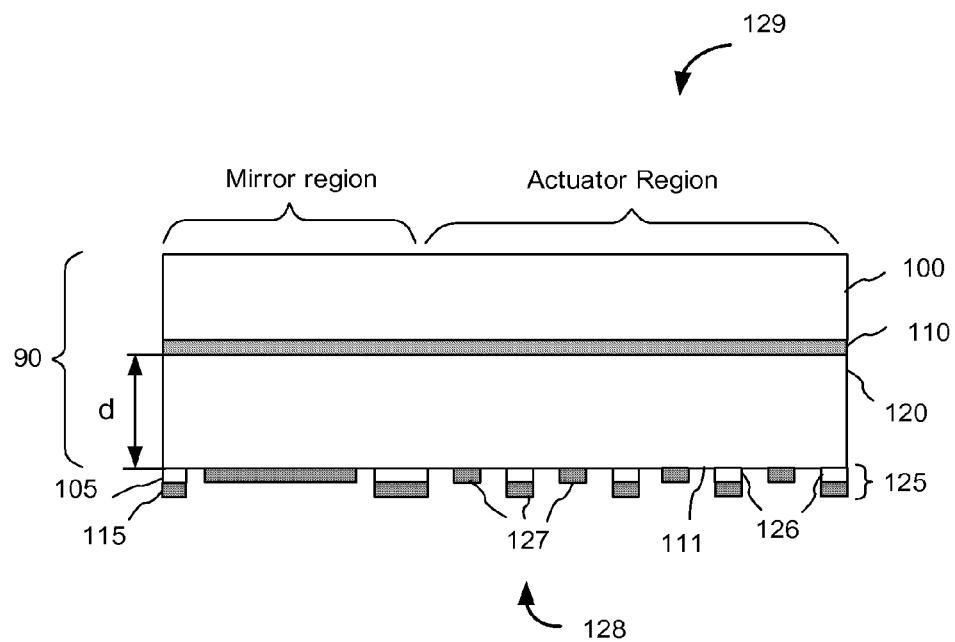
FIGS. 3A-3H are cross-sectional schematic diagrams illustrating the fabrication of an SVCD device according to an embodiment of the present invention.
Figure 3B:
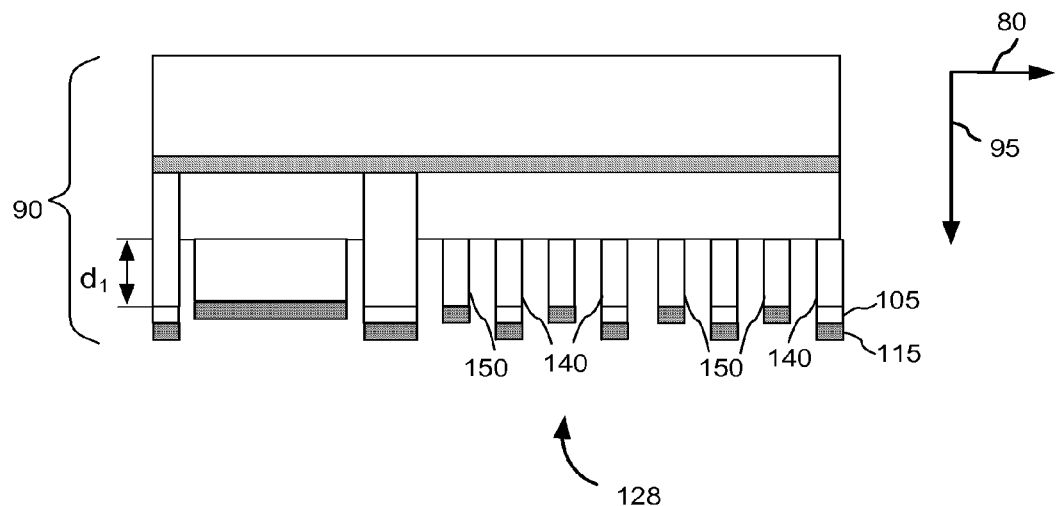
Figure 3C:
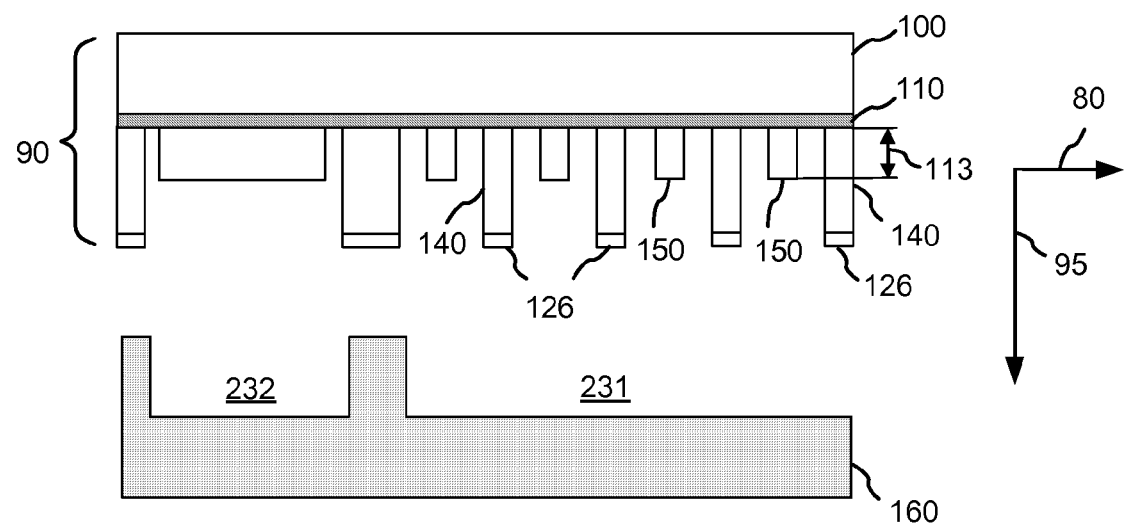
Figure 3D:
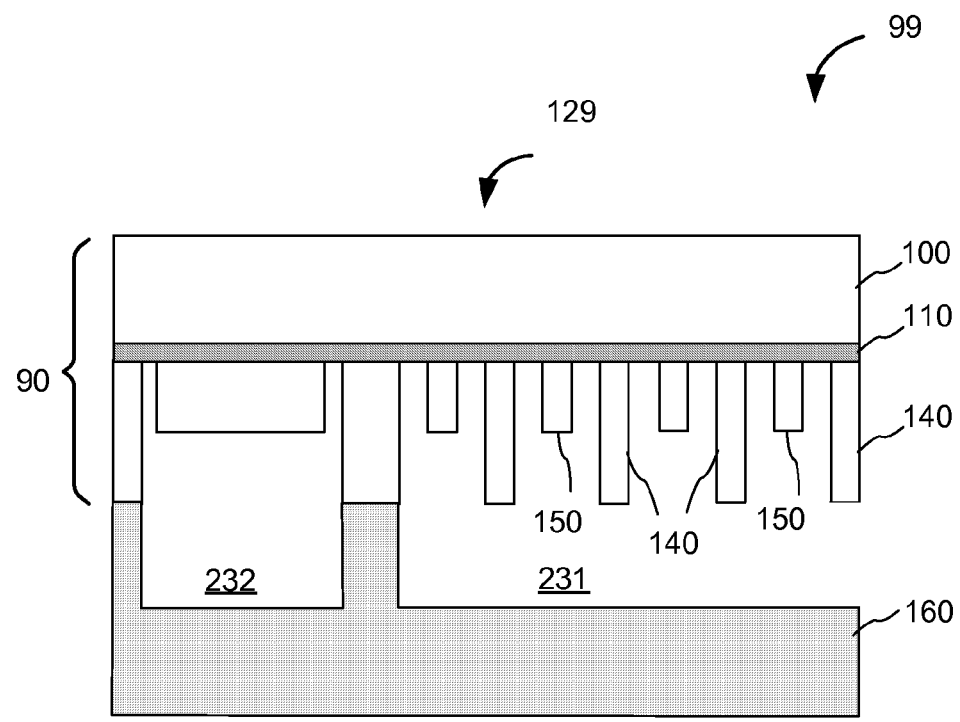
Figure 3E:
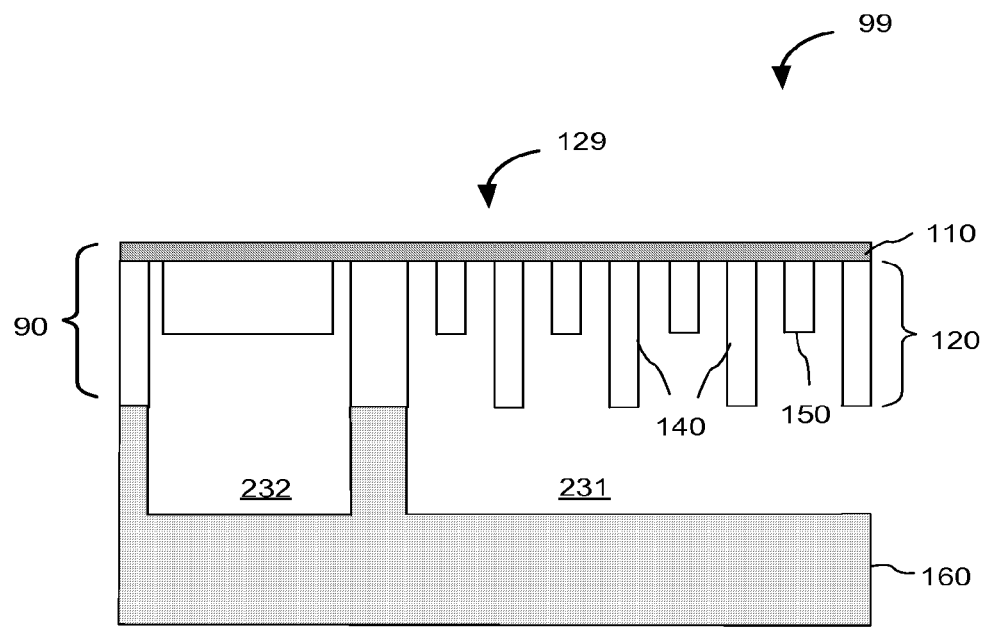
Figure 3F:
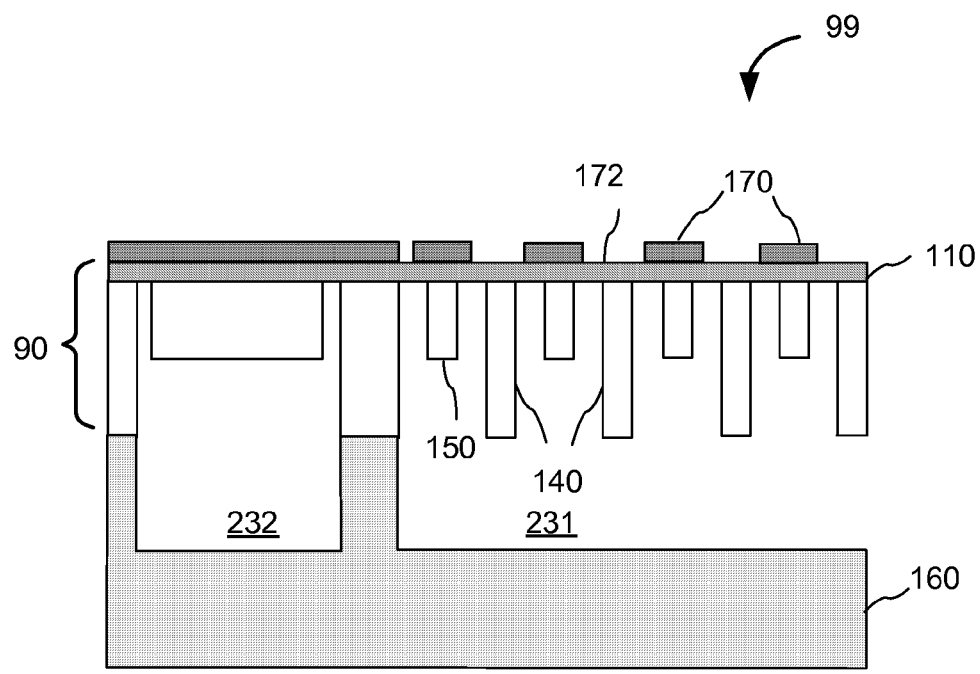
Figure 3G:
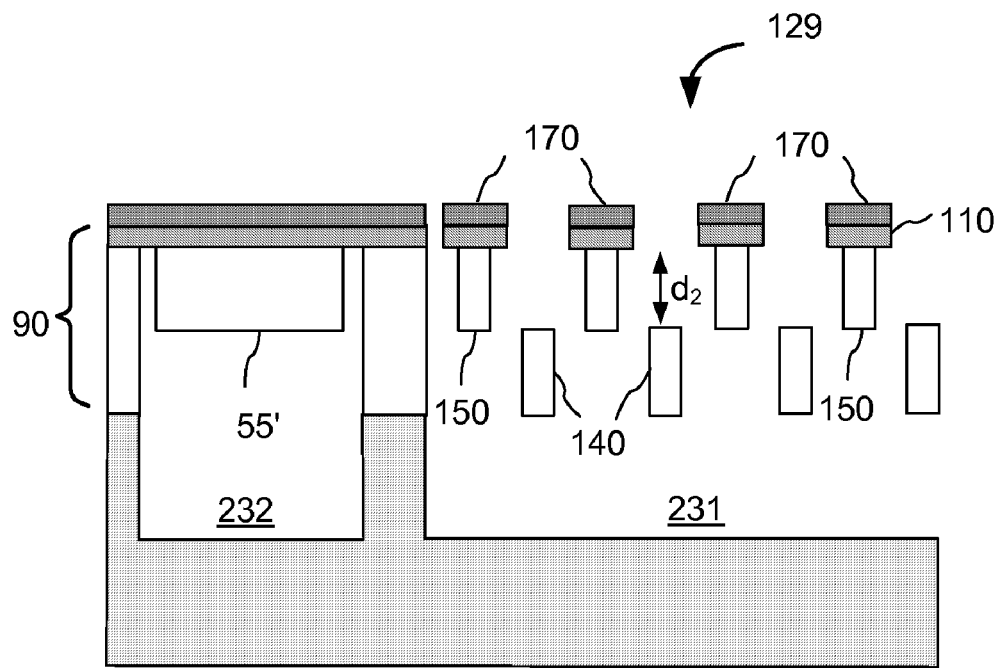
Figure 3H:
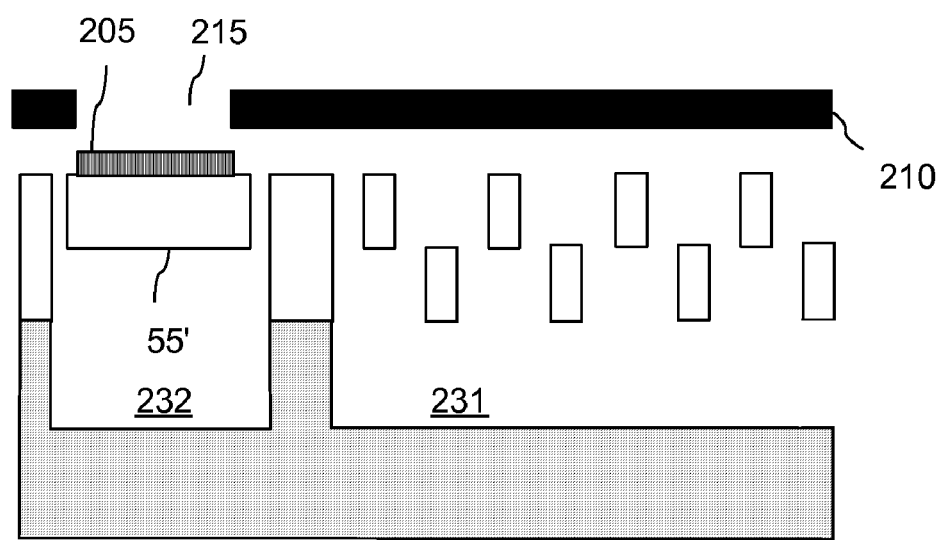
Figures 3I, 4:
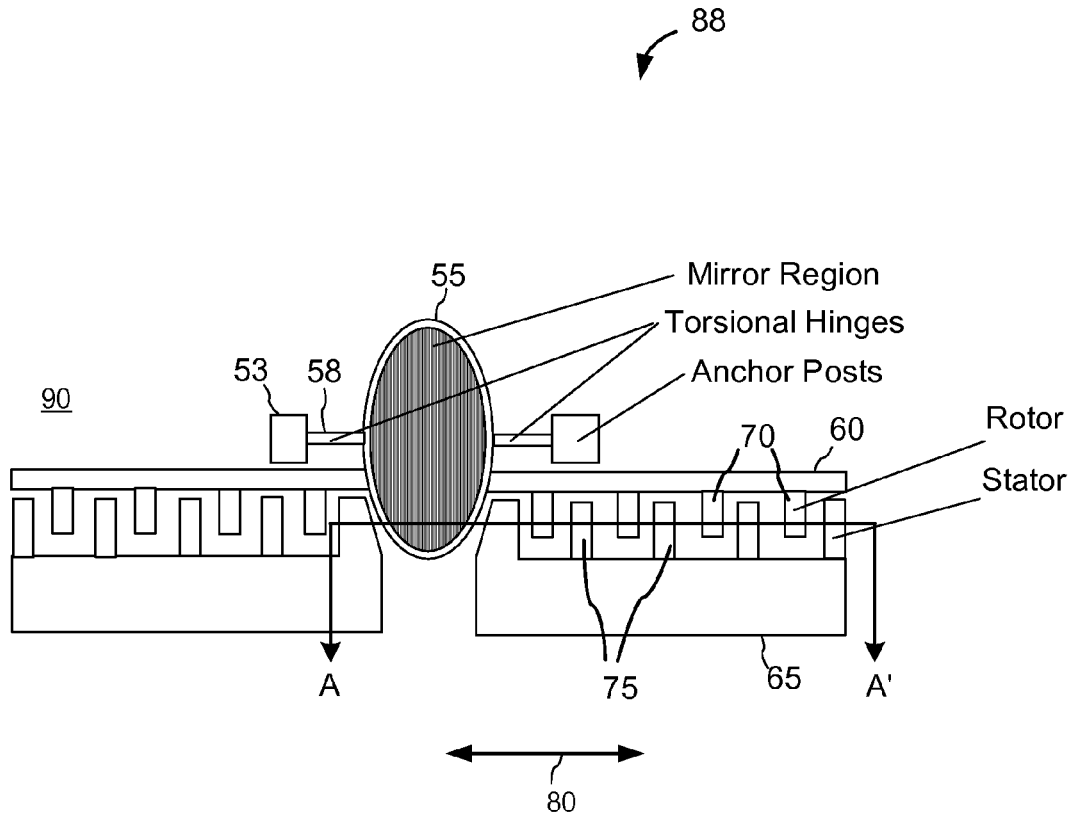
FIG. 3I is an exemplary legend of materials used in the fabrication process illustrated in FIGS. 3A-3H.
FIG. 4 is a schematic diagram illustrating a plane view of the SVCD device which fabrication is illustrated in FIGS. 3A-3H.

A preferred embodiment of the method for fabricating an SVCD device according to the present invention is illustrated in FIGS. 3A-3H and is hereafter described with reference to an SVCD device 88, a plane view of which is shown in FIG. 4; FIG. 3I shows an exemplary legend of materials used in the fabrication method of the present invention. One skilled in the art will however appreciate that the method of the present invention can be advantageously employed using a different set of materials, and for fabrication of many other types of SVCD devices having vertically offset features requiring precise lateral alignment.

As shown in this FIG. 4, the SVCD 88 includes a mirror 55, which is rotatable about torsional hinges 58 anchored by anchor posts 53. The mirror 55 is coupled to a movable comb assembly 60, hereinafter referred to as the rotor 60, which has a set of comb teeth, hereinafter referred as fingers 70. The rotor fingers 70 are positioned in-between fingers 75 of a stationary comb assembly 65, hereinafter referred to as the stator 65. The sets of stator and rotor fingers 75, 70 in the process of their fabrication will be referred to hereinafter as the first and second sets of fingers.

According to an exemplary embodiment of the present invention described hereinbelow, the SVCD 88 is fabricated from a silicon-on-isolator (SOI) wafer 90; FIGS. 3A-3H illustrate the fabrication process in one embodiment of the invention by schematically showing, at different stages of the processing, a vertical cross-section of a portion of the SOI wafer 90 along the AA' cross-section line indicated in FIG. 4.

With reference to FIG. 3A, the SOI wafer 90 is provided in a first step of the method; it has an isolation layer 110 of silicon oxide, hereinafter referred to also as the oxide layer 110, sandwiched between a base layer 100 supporting the structure, and a device layer 120, in a preferred embodiment both made of silicon. An arrow 128 indicates a side of the wafer 90 wherein the device layer 120 is located; it will be referred to hereinafter as the front side 128 of the wafer 90, with the opposite side of the wafer referred to as the back side 129, as indicated by a respectively labeled arrow. As described hereinbelow, the method of the present invention involves selectively etching of the device layer 120 from both the front and back side of the wafer 90.

First, a two-layer mask 125 is formed over a front side 128 of the device layer 120; the two-layer mask 125 covers portions of the device layer from which the sets of rotor and stator fingers are to be formed, and exposes for etching portions 111 of the device layer 120 between said eventual rotor and stator fingers, as illustrated in FIG. 3A.

In one embodiment, the two-layer mask 125 is formed as follows. A first masking layer 105, which is indicated in FIGS. 3A-C in white, for example one of silicon oxide, silicon nitride, aluminum, photoresist or other suitable material, is disposed over the device layer 120 and photolithographically patterned to form a first mask 126, which exposes portions of the device layer 120 from which the first set of fingers will be formed in the following steps, and covers portions of the device layer from which a second set of fingers will be formed. In the embodiment described herein, the first set of fingers corresponds to fingers 70 of the rotor 60, and the second set of fingers corresponds to fingers 75 of the stator 65. In other embodiments, the first set of fingers can be stator fingers, while the second set of fingers can be rotor fingers.

Next, a second masking layer 115, for example of a photoresist, is disposed over the device layer 120 and the first mask 126. The first and second masking layers contain different types of masking material, so that one can be selectively removed without substantially affecting the other. Portions of the second masking layer 115 are then selectively removed, for example using photolithography, according to a second pattern to form a second mask 127 defining locations of the first and second sets of fingers; more particularly, it covers portions of the device layer 120 which will eventually become the rotor fingers 70 and stator fingers 75, and exposes portions 111 of the device layer 120 and, optionally, of the first mask 126, between the locations of adjacent fingers of the first and second sets of fingers. Portions of the first mask 126 that are not covered by the second mask 127 defining the locations of the first and second sets of fingers are also removed using an etch process to which the second mask is resistant, i.e. has a substantially smaller etch rate, so as to align the first and second mask patterns over portions of the device layer 120 wherefrom the second set of fingers is formed, and to expose for etching the device layer 120 between locations of adjacent fingers of the first and second sets. Advantageously, the first and second masks 126, 127 formed by this process are self-aligned in lateral direction, as indicated by an arrow 80, over the locations of the second set of fingers, while the locations of the first set of fingers are protected, i.e. covered, only by the second mask 127, which defines both the rotor and the stator finger locations.

Next, in one embodiment of the invention the device layer 120 is etched to a desired first depth $d_1$, for example by using a timed deep reactive-ion etch (DRIE) or another suitable method of deep etching to form two comb structures with the first set of fingers 140 interdigited with the second set of fingers 150, as illustrated in FIG. 3B. The desired first depth $d_1$ is preferably about half of the thickness d of the device layer 120, $d_1 \approx 0.5d$, but can be either smaller or larger than 0.5d in other embodiments. This etch step will be hereinafter referred to as the first DRIE etch step, or the first DRIE etch. The second mask 127 is subsequently removed to expose the first set of fingers 150 to etching.

Turning now to FIG. 3C, a second etch of the front side of the wafer 90 is performed following the removal of the second mask 127, for example in a DRIE etcher, to etch through the device layer 120 between adjacent fingers of the first and second sets of comb fingers 150, 140, stopping at the oxide layer 110. After this step, the second set of fingers 140 extends substantially through the whole device layer 120 up to the oxide layer 110. Simultaneously, this second etch step removes a top portion of each un-masked finger from the first set of fingers 150, thereby vertically shortening, or thinning the first set of fingers 150 in a vertical direction indicated by an arrow 95. After this step, the first set of fingers 150 now extends from the oxide layer 110 in the vertical direction only to a fraction, e.g. about one half or less, of the thickness d of the device layer 120, as illustrated in FIG. 3C. The second etch step may be timed to stop when a desired height 113 of the second set of fingers 150 is reached.

The processing steps that produce the structure shown in FIG. 3C involve, substantially, i) etching of the device layer to form two comb structures comprising the first set of fingers 150 interdigited with the second set of fingers 140, and ii) removing a top portion of each finger from the first set of fingers 150 by etching to provide the first set of vertically shortened fingers interdigited with the second set of fingers. One skilled in the art would appreciate that these tasks can also be performed using an alternative etch process than that described hereinabove. For example, during the first DRIE etch step, the device layer 120 can be etched through up to the oxide layer 110, e.g. using the oxide layer 110 as an etch stop, so as to result in all the fingers from the first and second sets 140 and 150 being of the same height d, which can then be followed by the removal of the second mask 127 as described hereinabove, and a timed DRIE etch to remove the top portions of each finger from the first set of fingers 150 while leaving the second set of fingers 140 substantially intact.

Turning back to FIG. 3C, in a next step a carrier wafer 160 is attached, e.g. by fusion wafer bonding or using any other suitable wafer bonding or gluing method, to the front side 128 of the device layer 120, from which the first and second etch DRIE steps described hereinabove were performed, resulting in the formation of the two sets of fingers 140, 150 of different height as described hereinabove. By way of example, the carrier wafer 160 is a silicon wafer, preferably having a suitably isolating layer not shown herein, for example formed by silicon oxide for electrical isolation from the stator, but can also be a glass wafer, or may be made of any other suitable material strong enough for supporting the resulting SVCD structure. Optionally, the first mask 126 can be removed prior to bonding of the wafers 90 and 160. FIG. 3D illustrates the resulting two-wafer structure 99 wherein the device layer 120 is now supported by the carrier wafer 160, which preferably has recesses 231, 232 for accommodating, i.e. not impeding, the vertical motion of the mirror 55 and, optionally, of the first set of fingers 150, i.e. the rotor fingers, when the SVCD 88 is actuated by an applied voltage.

Turning now to FIG. 3E, in a next step the base layer 110 of the wafer 90 is at least partially thinned and removed, e.g. by anisotropic or isotropic etching, so as to expose the oxide layer 110 and, ultimately, the lower portions of the fingers 140 for etching; the words "lower portion" herein refer to a portion of a comb finger 140 that is closest to the back side 129 of the wafer 90.

Next, in FIG. 3F a third mask 170 is formed, for example with a photoresist, over the back side 129 of the wafer 90 on the exposed oxide layer 110, so as to protect the first set of fingers 150 during subsequent etching, and to expose to said etching portions 172 of said back side 129 of the wafer 90, or in the shown embodiment—portions of the oxide layer 110, underlying the second set of fingers 140. Advantageously, lateral alignment accuracy of the third mask 170 with respect to the locations of the second set of fingers 140 can be rather relaxed, as the required lateral positioning accuracy of openings in the mask 170 over the fingers 140 is in the order of a nominal distance between adjacent fingers of the first and second sets 140, 150, said distance being typically larger than the finger width, and typically exceeds two microns. By way of example, fingers of the first and second sets have each a width of 3 µm, the lateral distance between adjacent rotor and stator fingers 150, 140 is 4 µm, and the thickness of the device layer d is 20 µm.

With a reference to FIG. 3G, in a next step the back side 129 of the wafer 90 is etched to remove the oxide layer 110 where it is not covered by the third mask 170, so as to expose fingers of the first set 140 from the back side of the wafer. Subsequently, a lower portion of each exposed finger of the first set 140 is removed, e.g. in a DRIE etcher during a third DRIE etch step by etching to a second depth $d_2$, to vertically shorten, or make thinner the second set of fingers 140. The removal of the exposed oxide layer 110 not covered by the mask 170 may be performed in the same DRIE etch process that is employed for the thinning of the second set of fingers 140, or alternatively using a separate anisotropic or non-anisotropic etching process as would be known to those skilled in the art.

Advantageously, the step of thinning of fingers of the second set 140 by etching from the back side 129 of the wafer 90 results in the first and second sets of fingers 150, 140 being vertically offset relative to each other, thereby increasing a vertical distance between mid-points of adjacent fingers of the first and second sets 150 and 140, thereby enhancing the actuation range of the resulting SVCD device 88 illustrated in FIG. 4. As stated hereinabove, in the embodiment described herein the first and second sets of fingers 150 and 140 correspond to the rotor and stator fingers 70, 75 respectively, Turning now to FIG. 3H, in a next processing step the third mask 170 and the remaining oxide layer 110 are removed, and a reflective layer 205, for example of a metal such as gold, is deposited via an opening 215 in a shadow mask 210 over a mirror region 55' of the device layer 120, said mirror region 55' coupled to the first set of fingers 150, to form the reflective mirror 55 as shown in FIG. 4.

In another embodiment, the reflective layer 205 can be deposited over the oxide layer 110 after the removal of the base layer 100 as shown in FIG. 3E, and used, after patterning with a photoresist, to form the mask 170, which is then employed for reducing the vertical thickness of the second set of fingers 140, i.e. of the stator, as described hereinabove with reference to FIGS. 3F and 3G. The metal layer and the oxide layer 110 are then removed everywhere but the mirror region 55'.

Figure 5:
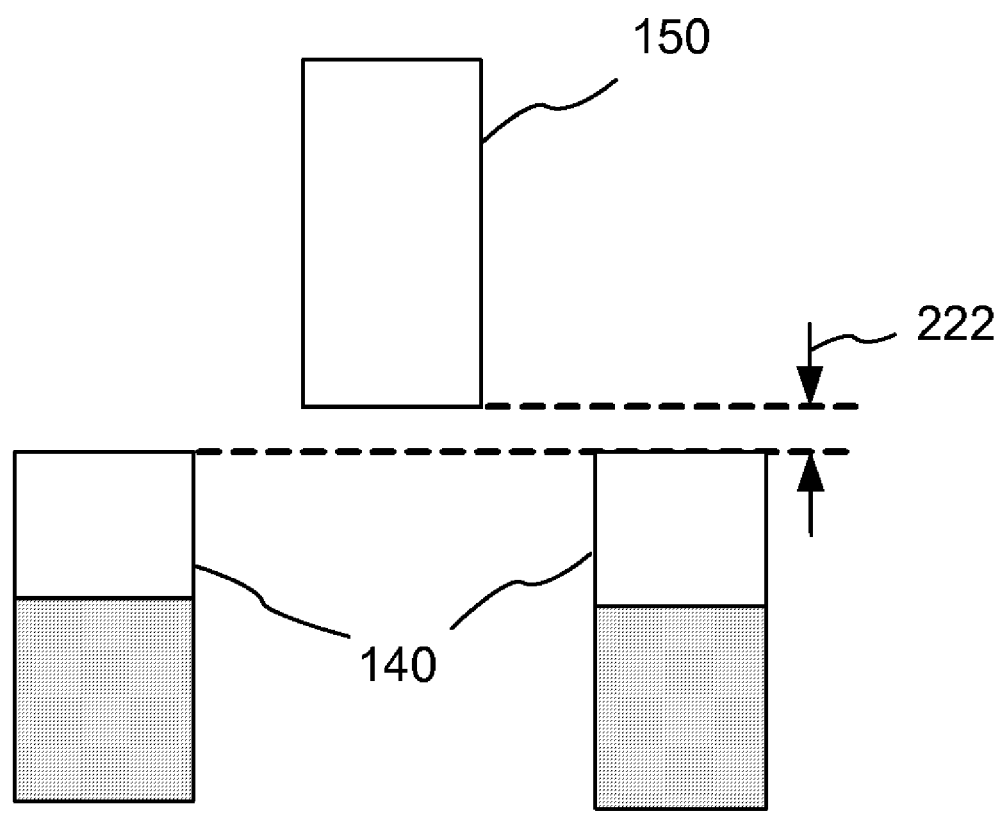
FIG. 5 is a cross-sectional schematic diagram of a portion of the SVCD device fabricated according to the present invention showing a vertical gap, not to scale, between the stator and rotor fingers.

The aforedescribed fabrication steps illustrated in FIGS. 3A-3H, which result in the formation of the SVCD device 88, illustrate the method of the present invention in one exemplary embodiment thereof. The method has several important advantages compared to the prior art. First, it automatically provides laterally aligned fingers of the first and second sets 150, 140, i.e. of the rotor and stator combs, since both sets of fingers are fabricated from the same device layer using a single mask, i.e. the second mask 127, which alone defines the lateral locations of both the stator and the rotor fingers. As a result, the method provides precise rotor-stator lateral alignment using standard photolithography. Furthermore, the method of the present invention enables one to control a vertical alignment of the rotor and stator fingers 150, 140 by controlling the first and second etch depths $d_1$ and $d_2$. For example, the fingers 140, 150 can be fabricated so that at zero applied voltage, i.e. with the SVCD in a resting state, there is a small and uniform vertical gap 222 therebetween as shown in FIG. 5, so as to provide a suitably large angular range of the stator movement while maintaining a suitably low operating voltage. Advantageously, the present method enables a greater control of said vertical gap 222 compared to the prior art vertical comb actuator described in U.S. Pat. No. 6,612,029, as the gap 222 in the SVCD device 88 is not subject to limitations due to electrical shorting. Simultaneously, the greater vertical offset between the stator and rotor fingers afforded by the present invention provides for an increased angular range of the rotor movement compared to an actuator wherein the rotor and stator fingers substantially overlap in the vertical direction, e.g. as the one described in US Patent Application 2007/0026614.

The present invention has been described hereinabove with reference to a particular embodiment thereof; however one skilled in the art will appreciate that the method of the present invention can also be advantageously practiced in other embodiments. For example, although the wafer 90 is referred to hereinabove as the SOI wafer, and the described embodiment of the method uses the silicon device layer 120 to form the rotor and stator of the SVCD device, in other embodiments the conductive device layer 120 and the base layer 100 may be made of other suitable materials including, but not limited to silicon, silicon-germanium, silicon-carbide, other semiconductor materials, or metals such as nickel, and gold. The insulating layer 110, which is in the aforedescribed preferred embodiment is silicon oxide, for example formed by thermal oxidation of the base silicon layer 100, in other embodiments may be alternatively made of any suitable insulating material including, but not limited to, silicon-nitride, silicon-oxide, silicon-carbide, quartz, high resistivity silicon, high resistivity silicon germanium, polyimide, or a polymeric film. Other substrates and combinations of materials may also be used in different fabrication processes realizing the method of the present invention. Also by way of example, the hinges 58, hereinabove referred to as torsional, can be alternatively embodied using serpentine hinges or other suitable types of hinges.

Figure 6A:
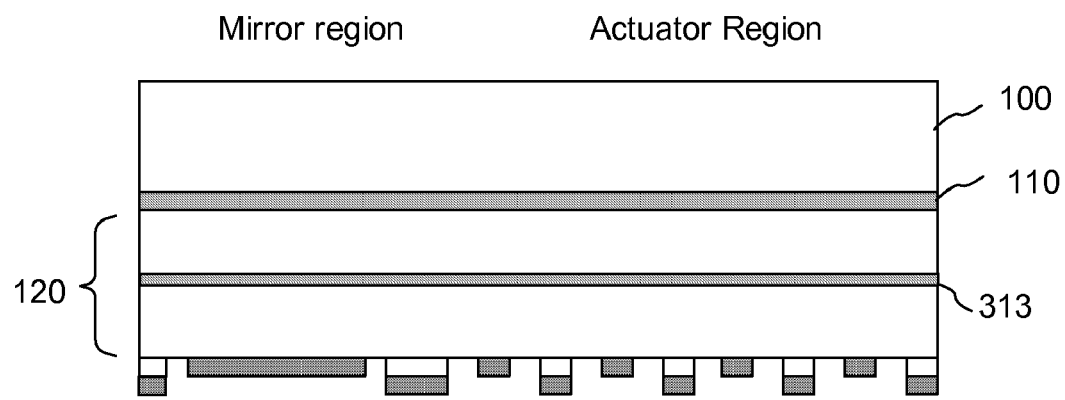
FIGS. 6A, 6B are cross-sectional schematic diagrams illustrating the fabrication of an SVCD device according to an embodiment of the present invention using an etch stop layer.
Figure 6B:
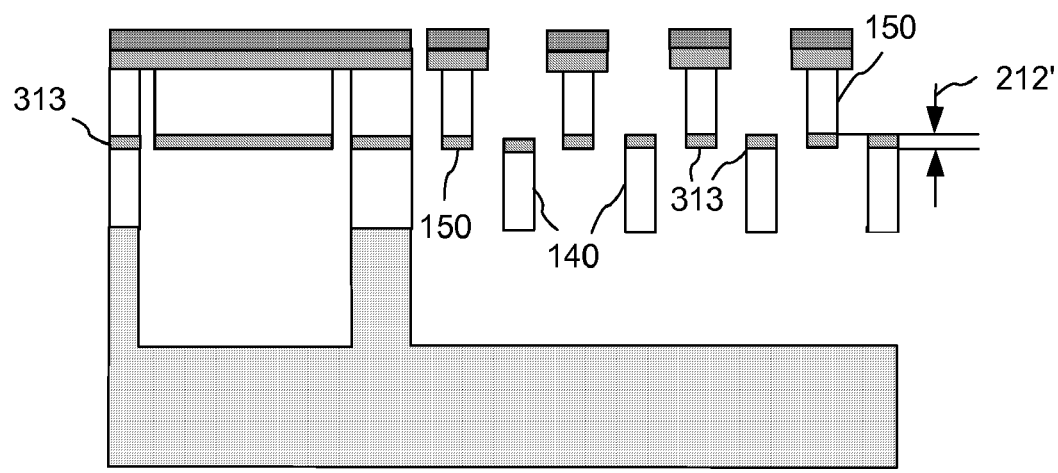

FIGS. 6A and 6B illustrate another embodiment of the invention, wherein the device layer 120 incorporates an etch stop layer 313, for example embodied as a silicon oxide layer, at a desired depth to control the etch depth during the second and, possibly, the first DRIE etch steps when portions of the first set of fingers 150 are removed. The same etch stop layer can subsequently be used in a third etch step which removes lower portions of the second set of fingers 140. This results in a structure shown in FIG. 6B, wherein the use of the etch stop layer 313 provides uniform height of fingers of the first and second sets 140, 150 across the wafer, and uniform vertical gap 222' between conducting portions of adjacent fingers, which size is advantageously controlled by the thickness of the etch stop layer 313.

Furthermore, one skilled in the art will appreciate that processing steps leading to the formation of the SVCD device 88 can be performed in a different order than that described hereinabove with reference to FIGS. 3A-3H. For example, the processing can start with performing a single-step timed DRIE etch of the device layer 120 of the wafer 90 front the front side 128 thereof to remove portions of the device layer 120 up to a predetermined depth at lateral locations of the first set of fingers 150, with a mask alignment tolerance in this step being relatively relaxed. After the front side of the wafer is bonded to the support wafer 160 and thinned, the two-step DRIE etch is performed, substantially as described hereinabove with reference to FIGS. 3B and 3C using a self-aligned two-layer mask such as the mask 125, but from the back side of the device layer 120 to form two self-aligned sets of fingers 140, 150, substantially as shown in FIG. 3H.

Of course numerous other embodiments may be envisioned without departing from the spirit and scope of the invention.

We claim:

1. A method for fabricating a staggered vertical comb drive, comprising the steps of:
  a) providing a wafer comprising a device layer;
  b) etching the device layer to form therein two comb structures comprising a first set of fingers interdigited with a second set of fingers;

c) removing a top portion of each finger from the first set of fingers by etching, so as to vertically shorten the first set of fingers; and, d) removing a lower portion of each finger from the second set of fingers by etching from a back side of the wafer, so as to vertically shorten the second set of fingers resulting in said second set of fingers being vertically offset from the first set of fingers.

2. A method according to claim 1, wherein step (a) includes the step of forming a two-layer mask over the device layer exposing portions thereof between fingers of the first and second sets.

3. A method according to claim 2, wherein the step of forming the two-layer mask comprises the steps of:

a1) forming a first mask over the device layer so as to expose portions thereof corresponding to the first set of fingers, a2) disposing, over the device layer and the first mask, a masking layer which is substantially resistant to an etch process used in step (b); and, a3) removing portions of the masking layer to form a second mask defining fingers of the first and second sets and exposing portions of the wafer therebetween.

4. A method according to claim 3, wherein step (a3) is followed by the step of a4) removing exposed portions of the first mask pattern using an etch process to which the masking layer is resistant, so as to align the first and second mask patterns over portions of the device layer wherefrom the second set of fingers is formed.

5. A method according to claim 4 comprising the step of removing the first mask prior to step (c).

6. A method according to claim 1, wherein step d) comprises the step of:

d1) first forming a third mask on the back side of the wafer to protect the first set of fingers during the etching in step (d), and to expose to said etchings the lower portions of the second set of fingers.

7. A method according to claim 1, further comprising the step of e) attaching a carrier wafer to the device layer following step (c) and prior to step (d).

8. A method according to claim 7, wherein the wafer further comprises a base layer and an isolation layer, wherein the isolation layer is sandwiched between the device layer and the base layer.

9. A method according to claim 8, further comprising the step of thinning the wafer by at least partially removing the base layer prior to step (d).

10. A method according to claim 1, wherein the device layer comprises a conductive layer.

11. A method according to claim 1, wherein the device layer comprises an etch stop layer.

12. A method according to claim 1, wherein the etching in one of steps (c) and (d) is timed.

13. A method according to claim 11, wherein the etch stop layer is for stopping etching of the first or second sets of fingers in at least one of steps (c) and (d), respectively.

14. A method according to claim 1, wherein the device layer comprises one or more semiconductor layers.

15. A method according to claim 14, wherein the one or more semiconductor layers comprise silicon.

16. A method according to claim 8, wherein the isolation layer comprises silicon oxide.

17. A method according to claim 3, wherein the masking layer used in step (a2) is a photoresist.

18. A method according to claim 3, wherein the first mask in step (a1) is formed from an oxide layer.

* * * * *